United States Patent [19]
Takayama et al.

[11] Patent Number: 5,068,716
[45] Date of Patent: Nov. 26, 1991

[54] SAMPLING RATE CONVERTER

[75] Inventors: Jun Takayama, Tokyo; Tadao Fujita; Takeshi Ninomiya, both of Kanagawa, all of Japan

[73] Assignee: Sony Corporation, Tokyo, Japan

[21] Appl. No.: 499,679

[22] Filed: Mar. 27, 1990

[30] Foreign Application Priority Data

Mar. 30, 1989 [JP] Japan .................................. 1-79532

[51] Int. Cl.$^5$ .......................................... H04N 11/04
[52] U.S. Cl. ......................................... 358/13; 358/12
[58] Field of Search .................... 358/13, 21 R, 22, 12

[56] References Cited

U.S. PATENT DOCUMENTS

| 4,520,386 | 5/1985 | Asaida | 358/13 |
| 4,870,661 | 9/1989 | Yamada et al. | 358/13 |
| 4,949,177 | 8/1990 | Bannister et al. | 358/12 |

FOREIGN PATENT DOCUMENTS 2138238 10/1984 United Kingdom .

OTHER PUBLICATIONS

Sampling Rate Up/Down Converter, Gillies et al., IEEE Transactions on Consumer Electronics, vol. 34, No. 1, Feb. 1988, pp. 256-261.

Primary Examiner—Howard W. Britton
Assistant Examiner—Kim Yen Vu
Attorney, Agent, or Firm—Alvin Sinderbrand; William S. Frommer

[57] ABSTRACT

In a sampling rate converter, an input digital video signal has its sampling rate converted from a first sampling frequency to a second or different sampling frequency by oversampling the input digital video signal at a rate which is an integral multiple of the first sampling frequency so as to generate zero values between data of the input digital video signal, interpolating an output signal from the oversampled input digital video signal, decimating the interpolated output signal for generating therefrom a digital video signal having the desired second sampling frequency, and only then applying the digital video signal having the second sampling frequency to a low pass filter, preferably of the finite impulse response type, for eliminating therefrom an undesirable signal component which is due to the sample rate conversion and which appears between frequency bands of one-half of the first and second sampling frequencies, respectively.

10 Claims, 3 Drawing Sheets

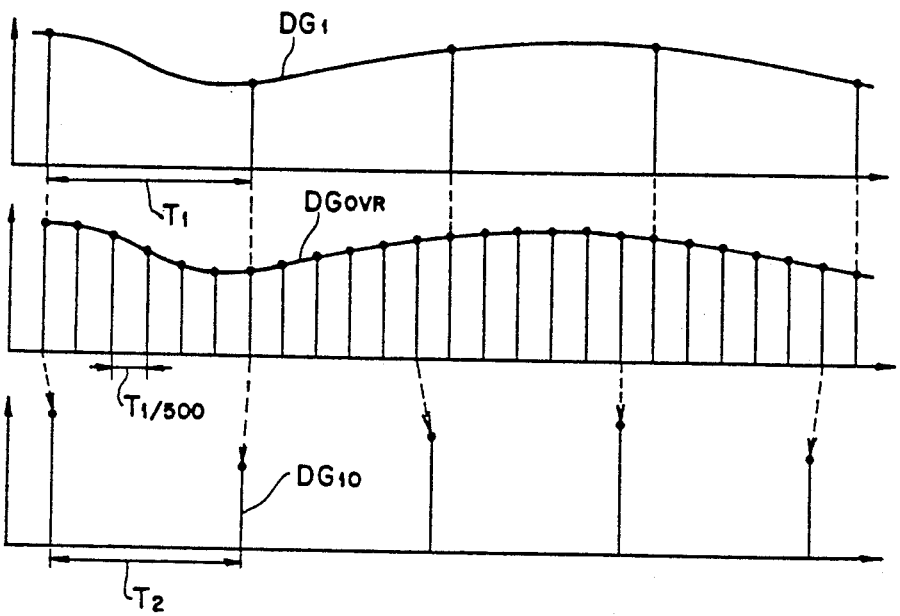
FIG. 4A
FIG. 4B
FIG. 4C
FIG. 5
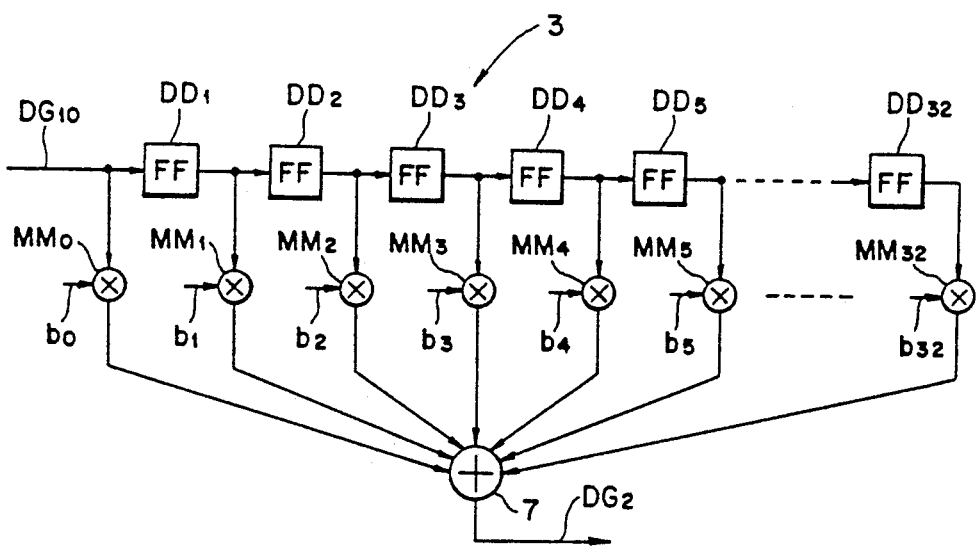

SAMPLING RATE CONVERTER

BACKGROUND OF THE INVENTION

1. Field of the Invention

This invention relates to a sampling rate converter and, more particularly, is directed to an apparatus by which the sampling rate of a digital signal may be converted from an initial sampling frequency to a different sampling frequency having a low correlation therewith.

2. Description of the Prior Art

It has been proposed, for example, as disclosed in detail in Japanese Laid-Open Patent 60-4324, published Jan. 10, 1985, and having a common assignee herewith, to provide a sampling rate converter primarily intended for use in connection with digital audio signals which have a relatively low sampling rate, and by which the initial sampling rate can be converted to an arbitrarily different sampling frequency having low correlation with the initial sampling rate. In such proposed sampling rate converter, the input digital signal is oversampled and the resulting oversampled signal is interpolated and then applied to a digital low pass filter, whereupon, the output of the digital low pass filter is supplied to a decimating circuit for generating therefrom a digital signal having the desired sampling frequency. Although the foregoing sampling rate converter comprising an interpolation circuit, a digital low pass filter and a decimation circuit, connected in series in the order named, can effect conversion of the sampling rate without aliasing noise, the digital low pass filter connected between the interpolation circuit and the decimation circuit has to be of a very high degree or order, particularly if the input digital signal is a digital video signal. For example, if the previously proposed sampling rate converter is used for converting a component-type digital video signal having a sampling frequency of 13.5 MHz into a digital video signal of the PAL composite-type having a sampling frequency of 17.734 MHz, the digital low pass filter, which is desirably of the finite impulse response (FIR) type, would need to have 16,500 stages in order to provide the sampling rate converter with desired predetermined conversion characteristics for maintaining the Nyquist frequencies in the transmission channel. Such a large number of stages in the digital low pass filter is impractical in that it makes it difficult to design the low pass filter as an integrated circuit.

OBJECTS AND SUMMARY OF THE INVENTION

Accordingly, it is an object of the present invention to provide a sampling rate converter which avoids the above described problems associated with the prior art.

More specifically, it is an object of the present invention to provide a sampling rate converter which is relatively simple and small and capable of providing desirable converting characteristics and accuracy.

Another object of the invention is to provide a sampling rate converter, as aforesaid, which employs a digital low pass filter comprised of a relatively small number of stages so as to reduce the size thereof and facilitate its design as an integrated circuit (IC).

Still another object of this invention is to provide a sampling rate converter, as aforesaid, which is suitable for use with a digital video signal or the like having a relatively high sampling rate.

In accordance with an aspect of this invention, an apparatus for converting the sampling rate of an input digital video signal having a first sampling frequency to a second sampling rate having a second sampling frequency different from the first sampling frequency, comprises oversampling means for oversampling the input digital video signal at a rate which is an integral multiple of the first sampling frequency so as to generate zero values between data of the input digital video signal, means connected to the oversampling means for interpolating an output signal therefrom, decimating means acting on the interpolated output signal for generating therefrom a digital video signal having the second sampling frequency, and low pass filter means receiving the digital video signal having the second sampling frequency for eliminating therefrom undesired signal components due to the converting of the sampling rate and which appear between frequency bands of one-half of the first and second sampling frequencies, respectively.

The above, and other objects, features and advantages of the invention, will be apparent in the following detailed description of an illustrative embodiment thereof which is to be read in connection with the accompanying drawings forming a part hereof and in which corresponding parts are identified by the same reference numerals in the several views.

BRIEF DESCRIPTION OF THE DRAWINGS

FIGS. 4A, 4B and 4C are signal waveforms to which reference will be made in describing the operation of the rate conversion filter of FIG. 3; and FIG. 5 is a connection diagram showing a low pass filter that is also included in the sampling rate converter of FIG. 1.

DETAILED DESCRIPTION OF A PREFERRED EMBODIMENT

Figure 1:
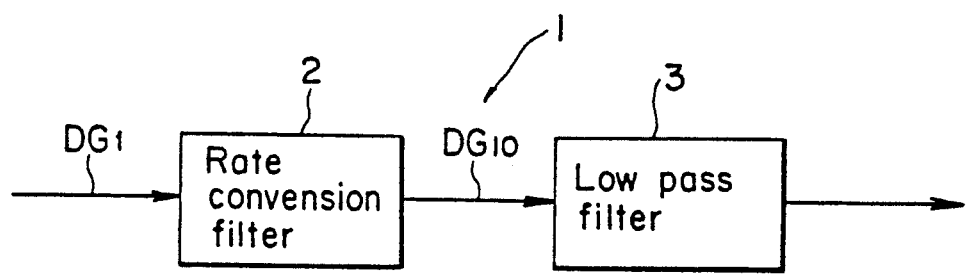
FIG. 1 is a block diagram showing a sampling rate converter according to an embodiment of the present invention.

Referring to the drawings in detail, and initially to FIG. 1 thereof, it will be seen that a sampling rate converter 1 according to an embodiment of the invention is there shown for converting a digital signal $DG_1$ having a first sampling frequency $f_1$ into a digital signal $DG_2$ having a second sampling frequency $f_2$ different from the first frequency $f_1$. The sampling rate converter 1 generally comprises an oversampling or rate conversion filter 2 for oversampling the digital signal $DG_1$ at a predetermined frequency band corresponding to the Nyquist frequency $f_1/2$ or $f_2/2$ of the first or second sampling frequency $f_1$ or $f_2$, respectively, which has the higher frequency, thereby obtaining a digital signal $DG_{10}$ having the second sampling frequency $f_2$, and a low pass filter 3 for limiting the frequency band of the output signal $DG_2$ to the Nyquist frequency $f_1/2$ or $f_2/2$ of the first or second sampling frequency $f_1$ or $f_2$ having the lower frequency, whereby there is eliminated from the digital signal $DG_{10}$ an undesirable signal component which is due to the sample rate conversion and which appears between frequency bands of the Nyquist frequencies $f_1$ and $f_2/2$.

The sampling rate converter 1 according to this invention is particularly adapted for converting a digital signal $DG_1$ having a relatively low first sampling frequency $f_1$, for example, a component type digital video signal having a sampling frequency $f_1$ of 13.5 MHz, into a digital signal $DG_2$ having a relatively high second sampling frequency $f_2$, for example, a digital video signal of the PAL composite type having a sampling frequency $f_2$ of 17.734 MHz.

It will be appreciated that, in practice, in converting the sampling rate of the digital signal $DG_1$ having a first sampling frequency $f_1$ to a digital signal $DG_2$ having a second sampling frequency $f_2$, no signals of substance appear between the Nyquist frequencies $f_1/2$ and $f_2/2$ of the signals $DG_1$ and $DG_2$, respectively. Therefore, undesirable signal components which appear between the Nyquist frequencies should be eliminated prior to transmission of the sampling rate converted signal $DG_2$ from the sampling rate converter 1. Thus, in the sampling rate converter 1, the rate conversion filter 2 is effective to convert the sampling rate from the frequency $f_1$ to the frequency $f_2$, and then the low pass filter 3 is effective to reject or eliminate the unnecessary or undesirable frequency components between the Nyquist frequencies.

The rate conversion filter 2 may be formed of a finite impulse response (FIR) type digital filter having, for example, 4,500 stages, and constituting, as a whole, a 500 - times oversampling filter. In that case, the rate conversion filter 2 has the Nyquist characteristic $C_2$ represented by the dotted line on FIG. 2. In other words, the rate conversion filter 2 converts the sampling rate from the sampling frequency $f_1$ to the sampling frequency $f_2$ under the conditions of Nyquist characteristic $C_2$. Such Nyquist characteristic $C_2$ is shown to be substantially flat up to the vicinity of the Nyquist frequency $f_1/2$ of the first sampling frequency $f_1$, and then declines gradually from the Nyquist frequency $f_1/2$ to the Nyquist frequency $f_2/2$ of the second sampling frequency $f_2$.

The digital signal $DG_{10}$ delivered from the rate conversion filter 2 to the low pass filter 3 for limiting by the latter to a predetermined frequency band, as previously described, is delivered from the low pass filter 3 as the output digital signal $DG_2$ having the sampling frequency $f_2$.

Figure 2:
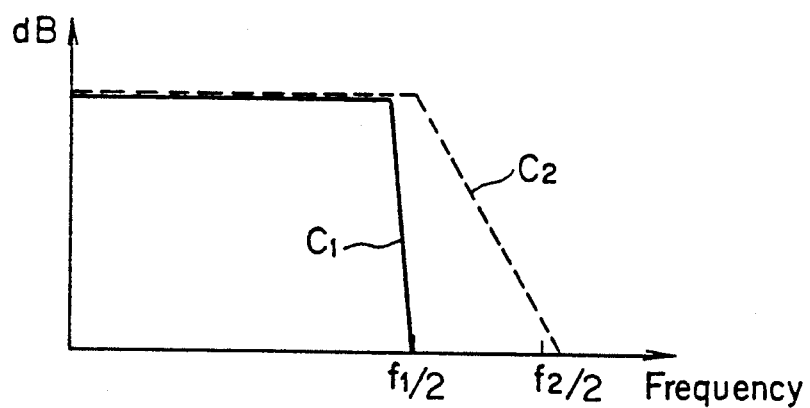
FIG. 2 is a characteristic diagram showing Nyquist characteristics of filters included in the sampling rate converter of FIG. 1.

The low pass filter 3 is desirably formed of an FIR type digital filter which, for example, has 33 stages, and desirably has the characteristic $C_1$ shown in solid lines on FIG. 2. Such characteristic $C_1$ is shown to be flat up to a frequency which is just below the Nyquist frequency $f_1/2$ of the first sampling frequency $f_1$, and then falls sharply at the frequency $f_1/2$. Therefore, the frequency band of the digital signal $DG_{10}$ supplied to the low pass filter 3 is limited thereby in accordance with the characteristic $C_1$.

Figure 3:
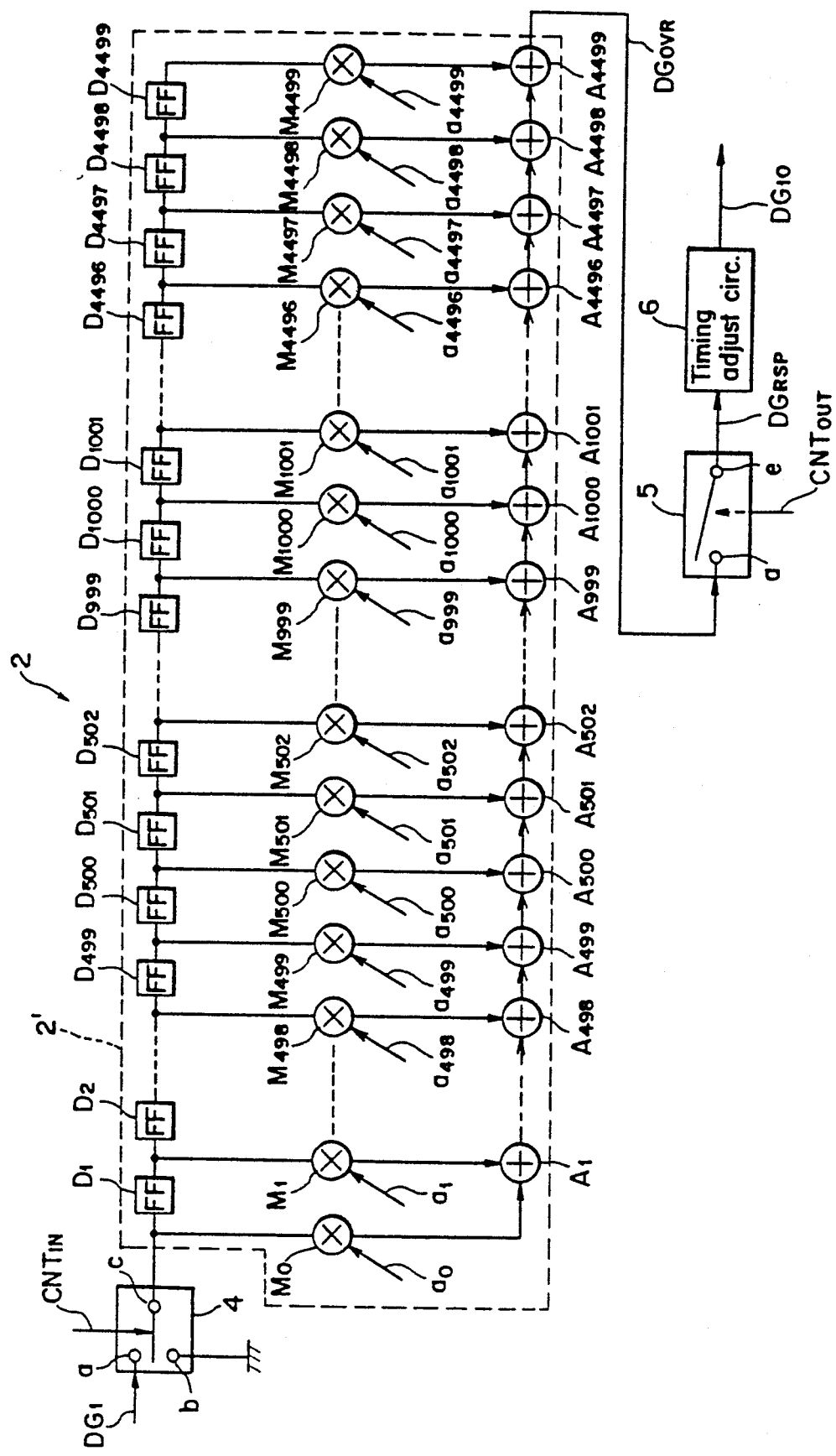
FIG. 3 is a connection diagram showing details of a rate conversion filter constituting one of the components of the sampling rate converter of FIG. 1.

In the preferred embodiment of this invention being described herein, the rate conversion filter 2 has the structural arrangement shown in FIG. 3 and includes, in addition to the FIR-type digital filter 2' having 4,500 stages, an oversampling circuit 4, a decimating circuit 5 and a timing adjustment circuit 6. More specifically, the oversampling circuit 4 is shown to be in the form of a switch having a first fixed contact a which receives the input digital signal $DG_1$ (FIG. 4A) having the first sampling frequency $f_1$, and a second fixed contact b connected to ground. The switch 4 further includes a movable contact c which is made to alternately engage the fixed contacts a and b by a suitable input control signal $CNT_{in}$ which has an oversampling frequency 500 $f_1$, that is, an oversampling frequency 500 times the first sampling frequency $f_1$, and which is supplied by a suitable input timing control circuit (not shown). During each cycle of the input control signal $CNT_{in}$, the movable contact c of the oversampling switch 4 engages the first contact a for a period of $T_1/500$, in which $T_1$ is the sampling period of the input digital signal $DG_1$. Thus, during each sampling period $T_1$ of the digital signal $DG_1$ the latter is sampled at a rate which is an integral multiple (500 times) of the first sampling frequency $f_1$ with zero values being generated between the oversampled data, that is, whenever the movable contact c engages the grounded fixed contact b.

The output of the oversampling switch 4 constituted by its movable contact c is connected to the FIR-type digital filter 2' which, in the illustrated embodiment, is shown to comprise a series circuit of 4,499 flip-flops (F.F.) $D_1$, $D_2$, ---$D_{4,499}$ which are operative as latches at the oversampling frequency 500 $f_1$ so as to each have a delay time of $T_1/500$. The FIR-type digital filter 2' of FIG. 3 is adapted to have the predetermined characteristic $C_2$ (FIG. 2) by being an FIR-type digital filter of the 9th order for the sampling period $T_1$. The FIR-type digital filter of FIG. 3 is further shown to have 4,500 multipliers $M_0$, $M_1$ --- $M_{4,499}$. The multiplier $M_0$ receives the digital signal input to the flip-flop $D_1$, while the multiplier $M_{4,499}$ receives the output digital signal from the flip-flop $D_{4,499}$. The intervening multipliers $M_1$ - $M_{4,498}$, receive the output digital signals from the flip-flops $D_1$ - $D_{4,498}$, respectively, which, of course, correspond to the input digital signals of the flip-flops $D_2$ - $D_{4,499}$, respectively. The foregoing described inputs to the multipliers $M_0$ - $M_{4,499}$ are multiplied therein by predetermined coefficients $a_0$ - $a_{4,499}$, respectively, and the multiplied results from the multipliers $M_0$ - $M_{4,4499}$ are added together by means of corresponding adders $A_1$ - $A_{4,4499}$, arranged as shown on FIG. 3. Thus, the input digital signal $DG_1$ is oversampled by a factor of 500 so as to provide an oversampled signal $DG_{OVR}$ (FIG. 4B) at the output of the adder $A_{4,499}$. Although the input digital signal $DG_1$ is, in fact, oversampled by a factor of 500, the oversampled signal $DG_{OVR}$ is shown on FIG. 4B to be oversampled only by a factor of 6 for ease of illustration.

The oversampled signal $DG_{OVR}$ is supplied to an input terminal d of the decimating circuit 5 which is shown on FIG. 3 to be in the form of a switch intermittently closed in response to an output control signal $CNT_{OUT}$ supplied from a suitable output timing control circuit (not shown) and having the second sampling frequency $f_2$ so as to be closed or turned ON at intervals of the sampling period $T_2$ of the second sampling frequency $f_2$. Thus, at the output terminal e of the decimating circuit 5 there is obtained a resampled or decimated signal $DG_{RSP}$ which is resampled approximately in synchronism with the second sampling signal $f_2$. This decimated or resampled signal $DG_{RSP}$ is input to the subsequently arranged timing adjustment circuit 6 in which it is suitably synchronized with the second sampling frequency $f_2$ for providing the digital signal $DG_{10}$ (FIG. 4C) having the second sampling frequency $f_2$ and which appears at the output of the rate conversion filter 2.

In the preferred embodiment being presently described, the low pass filter 3 is structurally arranged as shown in FIG. 5, that is, is in the form of an FIR-type digital filter, which receives, at its input, the digital signal $DG_{10}$ whose sampling rate has been already converted by the rate conversion filter 2 to the second sampling frequency $f_2$.

The FIR-type digital filter 3 is shown on FIG. 5 to comprise a series circuit of 32 flip-flops $DD_1$, $DD_2$, --- $DD_{32}$ operative at the second sampling frequency $f_2$ and each having a delay equivalent to the sampling period $T_2$ of the sampling frequency $f_2$. The FIR-type digital filter 3 is adapted to have the predetermined characteristic $C_1$ (FIG. 2) by reason of its being formed as an FIR digital filter of the 33rd order for the sampling period $T_2$.

The FIR-type digital filter 3 is further shown to have 33 multipliers $MM_0$, $MM_1$, --- $MM_{32}$. The multiplier $MM_0$ receives the digital signal $DG_{10}$ which is input to the flip-flop $DD_1$, while the multiplier $MM_{32}$ receives the output digital signal from the flipflop $DD_{32}$. The intervening multipliers $MM_1$ - $MM_{31}$ receive the output digital signals from the flip-flops $DD_1$ - $DD_{31}$, respectively, which, of course, correspond to the input digital signals of the flip-flops $DD_2$ - $DD_{32}$, respectively. The foregoing described inputs to the multipliers $MM_0$ - $MM_{32}$ are multiplied therein by predetermined coefficients $b_0$ - $b_{32}$, respectively, and the multiplied results from the multipliers $MM_0$ - $MM_{32}$ are added together in an adder 7 to provide the digital signal $DG_2$ as the output therefrom. It will be understood that the FIR-type digital filter 3 is operative to limit the pass-band of the digital signal $DG_{10}$ input thereto with the result that the output digital signal $DG_2$ will have the predetermined desired characteristic $C_1$ and the second sampling frequency $f_2$.

According to experiments that have been conducted, if a sampling rate converter employs only a rate conversion filter, as shown in FIG. 3, for oversampling the input digital signal $DG_1$ by a factor of 500 and for obtaining the output digital signal $DG_2$ with the desired characteristic $C_1$, it is necessary to provide the FIR-type digital filter 2' with at least 16,500 stages, as earlier noted in discussing the published Japanese patent 60-4324. Obviously, such a large number of stages of the filter 2' for achieving the desired characteristic $C_1$ is impractical from the standpoint of providing such filter as an integrated circuit. The large number of stages required in the filter disposed in advance of the decimating circuit if such filter is to be employed for limiting the output digital signal $DG_2$ to the characteristic $C_1$, results from the fact that the filter positioned in advance of the decimating circuit has to handle 500 times as much data as a low pass filter disposed after the decimating circuit, as in the case of the filter 3.

In contrast to the arrangement according to the prior art which would require 16,500 stages in a low pass filter in advance of the decimating circuit for limiting the output digital signal having the second sampling frequency $f_2$ to the characteristic $C_1$, the apparatus according to the present invention can achieve the same results with only a total of 4,533 stages in the FIR-type filters, that is, 4,500 stages in the FIR-type filter 2' of the rate conversion filter 2 and 33 stages in the low-pass filter 3 which follows the decimating circuit 5 and hence operates on a greatly reduced amount of data. It will be appreciated that, in view of the foregoing, the circuit configuration of the sampling rate converter 1 according to the present invention can be greatly simplified and easily incorporated in an integrated circuit without sacrificing either the converting characteristic or accuracy thereof.

By way of summary, it will be seen that, in the preferred embodiment of the invention described above, a digital signal $DG_1$ having a first sampling frequency $f_1$ is oversampled at a predetermined frequency band corresponding to the Nyquist frequency $f_2/2$ of a second sampling frequency $f_2$ which is higher than the first sampling frequency $f_1$ so as to obtain a digital signal $DG_{10}$ having the second sampling frequency $f_2$, whereupon the frequency band of the digital signal $DG_{10}$ is limited according to the Nyquist frequency $f_1/2$ of the first sampling frequency $f_1$. Thus, the number of stages or orders of the oversampling filter can be very greatly decreased, for example, from 16,500 stages to 4,500 stages, with the result that a sampling rate converter having a predetermined sampling rate converting characteristic and accuracy can be achieved with a simplified overall structure.

In the preferred embodiment of the invention specifically described above, the sampling rate of the input digital signal $DG_1$ having a first sampling frequency $f_1$ is converted to a second sampling frequency $f_2$ which is higher than the first sampling frequency $f_1$, but it is to be understood that the present invention is not limited in that respect. In other words, the present invention can be similarly applied to a situation in which the sampling rate of the input digital signal is to be converted to a lower sampling frequency. In such case, the order in which the rate conversion filter 2 and the low pass filter 3 are positioned in FIG. 1 may be reversed so that the input digital signal first has its frequency band limited by means of the low pass filter 3 and then the output of the filter 3 is supplied to the rate conversion filter 2 so as to issue therefrom with the desired sampling frequency lower than that of the input digital signal.

Further, in the specifically described embodiment of the invention, an oversampling factor of 500 has been employed, but it will be appreciated that other oversampling factors can be selected, as desired.

Similarly, although the specifically described embodiment of the invention employs 4,500 stages in the FIR-type digital filter 2' of the rate conversion filter 2, that is, 9. stages for each of the 500 oversampled periods $T_1/500$ included in each sampling period $T_1$ of the input digital signal $DG_1$, and 33 stages in the low pass filter 3 for each period $T_2$ of the digital signal $DG_{10}$, the numbers of stages provided in each of the FIR-type digital filters 2' and 3 are not limited to those specified, but may be otherwise suitably selected in accordance with the required Nyquist characteristics.

Finally, although the specifically described embodiment of the invention refers to the case in which video signals of a PAL component type having a sampling frequency $f_1 = 13.5$ MHz are converted to video signals of a PAL composite type having a sampling frequency $f_2 = 17.734$ MHz, the invention is not limited thereto and can be applied similarly to any other situation where the sampling frequency of a digital signal is to be converted to another sampling frequency having a low correlation therewith.

Although a specific preferred embodiment of the invention has been described in detail herein with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:

1. A sampling rate converting apparatus for converting a sampling rate of an input digital video signal having a first sampling frequency to a second sampling rate having a second sampling frequency different from said first sampling frequency, comprising:

oversampling means receiving said input digital video signal for oversampling the latter at a rate which is an integral multiple of said first sampling frequency so as to generate zero values between data of said input digital video signal;

means connected to said oversampling means for interpolating an output signal therefrom;

decimating means acting on the interpolated output signal for generating therefrom a digital video signal having said second sampling frequency; and low pass filter means acting on said digital video signal having the second sampling frequency from said decimating means, said low pass filter means eliminating from said digital video signal having the second sampling frequency an undesired signal component due to the converting of the sampling rate and which appears between frequency bands of one-half of said first and second sampling frequencies, respectively.

2. A sampling rate converting apparatus according to claim 1; in which said second sampling frequency is larger than said first sampling frequency.

3. A sampling rate converting apparatus according to claim 2; in which said low pass filter means has a cutoff frequency which is one-half of said first sampling frequency.

4. A sampling rate converting apparatus according to claim 3; in which input digital video signal having said first sampling frequency is a component-type video signal.

5. A sampling rate converting apparatus according to claim 4; in which said first sampling frequency is 13.5 MHz.

6. A sampling rate converting apparatus according to claim 4; in which said digital video signal having said second sampling frequency is a composite-type video signal.

7. A sampling rate converting apparatus according to claim 6; in which said component-type video signal and said composite-type video signal are both PAL signals.

8. A sampling rate converting apparatus according to claim 7; in which said first and second sampling frequencies are 13.5 MHz and 17.734 MHz, respectively.

9. A sampling rate converting apparatus according to claim 8; in which said low pass filter means includes a finite impulse response type digital filter.

10. A sampling rate converting apparatus according to claim 8; in which said oversampling means includes a finite impulse response type digital filter.

* * * * *